US012339700B2

(12) United States Patent
Liang et al.

(10) Patent No.: US 12,339,700 B2
(45) Date of Patent: Jun. 24, 2025

(54) TRANSIENT CURRENT-MODE SIGNALING SCHEME FOR ON-CHIP INTERCONNECT FABRICS

(71) Applicant: NVIDIA Corp., Santa Clara, CA (US)

(72) Inventors: Jiale Liang, San Jose, CA (US);
Tezaswi Raja, San Jose, CA (US);
Suhas Satheesh, Sunnyvale, CA (US);
Shalimar Rasheed, San Jose, CA (US);
Gaurav Ajwani, Union City, CA (US);
Ram Kumar Ranjith Kumar, Brantford (CA); Miloni Mehta, San Jose, CA (US)

(73) Assignee: Nvidia Corp., Santa Clara, CA (US)

( * ) Notice: Subject to any disclaimer, the term of this patent is extended or adjusted under 35 U.S.C. 154(b) by 356 days.

(21) Appl. No.: 18/164,590

(22) Filed: Feb. 5, 2023

(65) Prior Publication Data
US 2024/0264625 A1    Aug. 8, 2024

(51) Int. Cl.
*G06F 1/08* (2006.01)
*H03K 5/01* (2006.01)
*H03K 5/00* (2006.01)

(52) U.S. Cl.
CPC ................. *G06F 1/08* (2013.01); *H03K 5/01* (2013.01); *H03K 2005/00019* (2013.01)

(58) Field of Classification Search
None
See application file for complete search history.

(56) References Cited

U.S. PATENT DOCUMENTS

| 6,686,763 | B1 | 2/2004 | Yen |
| 10,944,402 | B1 * | 3/2021 | Kim ...................... H01L 23/522 |
| 2007/0103199 | A1 | 5/2007 | Tzartzanis et al. |

FOREIGN PATENT DOCUMENTS

| TW | I517577 | B | 1/2016 |
| TW | 202042484 | A | 11/2020 |

* cited by examiner

*Primary Examiner* — Cassandra F Cox
(74) *Attorney, Agent, or Firm* — Carnelian Law, LLC

(57) ABSTRACT

Circuits that include one or more transmission lines to propagate a signal through a serially-arranged plurality of repeaters, and one or more control circuits to propagate control pulses to the repeaters, wherein a timing and duration of the control pulses is configured to operate the repeaters in current-mode signaling (CMS) mode during a state transition of the signal at the repeaters and to operate the repeaters in voltage-mode signaling (VMS) mode otherwise.

17 Claims, 14 Drawing Sheets

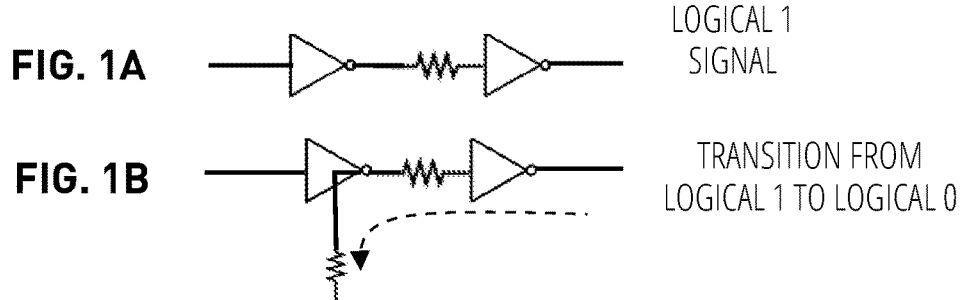
FIG. 1A — LOGICAL 1 SIGNAL
FIG. 1B — TRANSITION FROM LOGICAL 1 TO LOGICAL 0
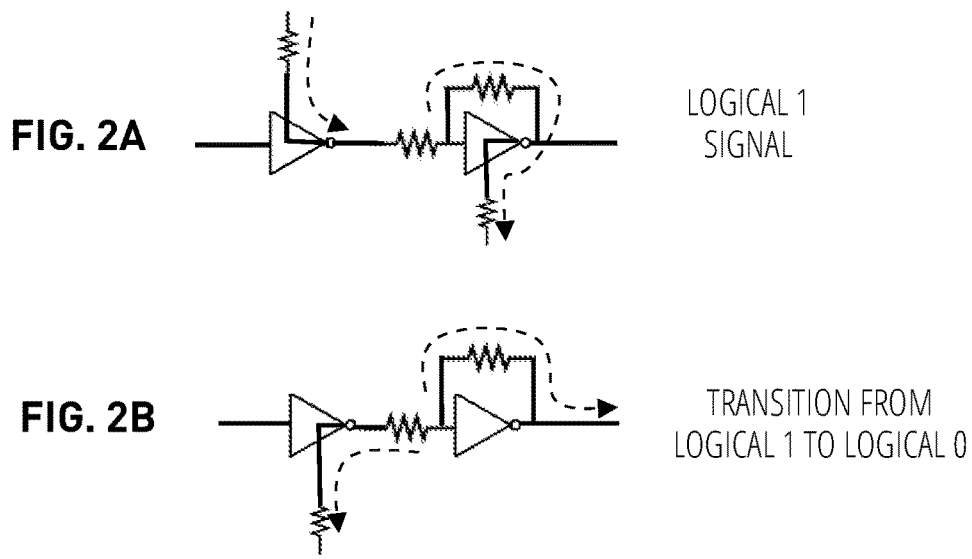
FIG. 2A — LOGICAL 1 SIGNAL
FIG. 2B — TRANSITION FROM LOGICAL 1 TO LOGICAL 0
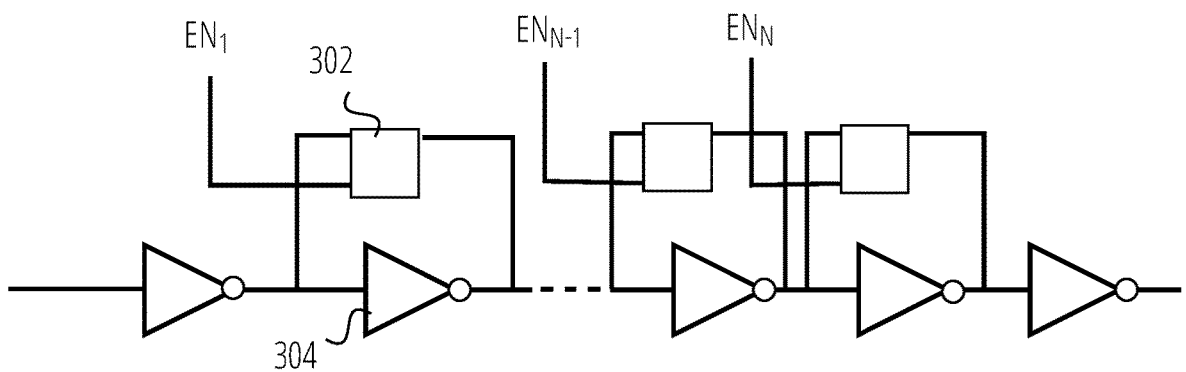
FIG. 3

US 12,339,700 B2

TRANSIENT CURRENT-MODE SIGNALING SCHEME FOR ON-CHIP INTERCONNECT FABRICS

BACKGROUND

The speed and power of transistors tend to scale beneficially with improvement in technology nodes. However, signaling interconnects between components do not tend to scale beneficially. This makes interconnects, especially high-density interconnects such as networks-on-a-chip, a bottleneck in advanced chip design. This has negative consequences for chip reliability and performance per watt of power.

Therefore, it is desirable to implement signaling schemes that improve power performance at a latency and area constraint, or optimize latency at a power and area constraint. Conventional long on-chip interconnects may utilize voltage-mode signaling (VMS), with which signals are rail to rail (e.g., supply voltage VDD to circuit ground GND).

An alternative mechanism, current-mode signaling (CMS), may provide speed enhancement over VMS mechanisms. However, conventional CMS techniques consume large static (idle) power. They also often utilize complex transmit/receive circuits that impose large latency and area overheads. Conventionally, CMS interconnects have primarily been utilized for off-chip wires and global on-chip wires that have low density and low resistive-capacitive (RC) loading. Implementation of CMS in high density, pipelined on-chip interconnects such as fabrics remains a challenge.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 1A and FIG. 1B depict a VMS-mode repeater in one embodiment.

FIG. 2A and FIG. 2B depict a CMS-mode repeater in one embodiment.

FIG. 3 depicts a signal transmission path in one embodiment.

DETAILED DESCRIPTION

Figure 4:
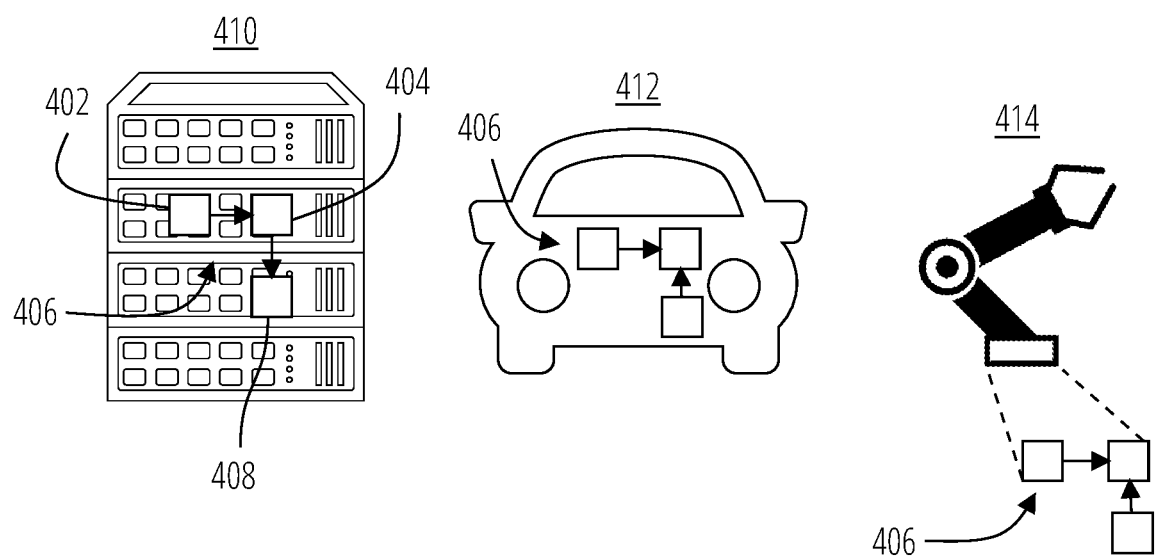
FIG. 4 depicts a circuit 402 in accordance with one embodiment.

VMS signaling mechanisms (see FIG. 1A and FIG. 1B) are typically terminated at a high (e.g., on the order of megaohms) impedance (e.g., at a MOSFET gate). CMS signaling mechanisms (see FIG. 2A and FIG. 2B) in contrast typically utilize a low impedance termination at the receiver, which reduces signal swing and increases bandwidth.

CMS mechanisms may utilize a feedback coupling between the input and output of each inversion repeater. This feedback mechanism may utilize the inverters already present in typical signaling fabrics, thus incurring no additional area overhead.

Signaling fabrics may differ from interconnects generally in at least the following aspects:
 i. Fabrics may comprise pipelined transmission paths.
 ii. Fabrics may comprise reclocking flops or latches, not only repeaters as in some interconnects.
 iii. Fabrics may comprise greater circuit density and lower spacing between transmission paths.
 iv. Fabrics may utilize a smaller pitch that incurs a higher wire RC (resistive-capacitive load).
 v. Fabrics may utilize smaller driver circuits to save power.

The disclosed mechanisms may enable CMS fabrics to achieve comparable density to VMS fabrics. No extra transmit/receive circuits need be added, and CMS-mode operation may be implemented for conventional VMS-mode fabrics by transiently enabling (turning on) the feedback mechanism (e.g., switching on transmission gates between the input and output of the repeaters).

One challenge to implementation of CMS in fabrics is the diminishment of signal swing as the signal passes through more repeater stages. The signal swing diminishes due to parasitic RC loads along the signal transmission path. With CMS mechanisms the attenuated signal is boosted up to the original value at each repeater output, but the swing loss is not fully recovered. As a result, signals may be corrupted (e.g., flipped in logical value by noise) after a number of transmission stages. Moreover, fabrics operated with CMS mode always-on may consume an amount of power that is unacceptable.

Embodiments of transient-mode CMS mechanisms in fabrics are herein disclosed herein utilizing a relative timing between two clock signals, and various adjustable delay elements, to generate control pulses that control the operational state of CMS feedback paths. Utilizing these mechanisms, during the time when a signal level (e.g., logical 1) is stable at the repeaters, CMS-mode is switched off, and the signals may be recovered to full swing. During a time when the state of the signals is in transition (e.g., from logical 1 to logical 0), CMS-mode is switched on.

Although described herein in conjunction with exemplary fabric embodiments, the disclosed mechanisms are applicable to signal transmission more generally. For example, the disclosed mechanisms may be applied to improve the signal propagation speed and integrity over single-path point-to-point interconnects in large-scale integrated chips and on printed circuit boards.

Circuit are disclosed that include a transmission line to propagate a signal through a serially-arranged plurality of repeaters, wherein a control circuit is utilized to propagate control pulses to the repeaters, and a timing and duration of the control pulses is configured to operate the repeaters in current-mode signaling (CMS) mode during a state transition of the signal at the repeaters and to operate the repeaters in voltage-mode signaling (VMS) mode otherwise. Propagation of the signal along the transmission line may be initiated by a first clock signal and the duration and timing of the control pulses may be determined by a second clock signal. The control circuit may propagate the control pulses to the repeaters in VMS-mode, and may include a same number of repeaters as the transmission line. The control pulses may be applied to operate transmission gates shunting the repeaters.

Signaling interconnects are disclosed that include many transmission lines and repeaters and transmission gates arranged along the transmission lines. The fabrics comprise at least one, and possibly multiple, control circuits that are configured to propagate control pulses sequentially to the transmission gates, with a timing and width of the control pulses being configured to sequentially close, i.e., turn on, (one after the other, as the control pulses propagate along the control circuit) the transmission gates prior to and during the state transition of signals on the transmission lines at the inputs of the repeaters and to sequentially open, i.e., turn off, the transmission gates subsequent to the state transition at outputs of the repeaters.

The signaling interconnect may include a single pulse generator (per stage, if the interconnect extends for multiple stages) to generate the timing and width of the control pulses for all the transmission lines in the signaling interconnect, and may be disposed with a plurality of pulse generators, each configured to generate the timing and width of the control pulses for a different group of transmission lines in the signaling interconnect.

In one embodiment, an interconnect or fabric may include a first clock pulse generator configured to generate a first clock pulse (typically, a periodic series of pulses), a second clock pulse generator configured to generate a second clock pulse (typically also a periodic series of pulses) earlier than the first clock pulse, a control pulse generator configured to convert the second clock pulse(s) into control pulse(s), and one or more transmission lines configured to initiate propagation of signal(s) upon receiving the first clock pulse(s). The transmission line(s) include repeaters shunted (meaning their inputs are coupled via a feedback to their outputs) by transmission gates). The control circuit configured to propagate the control pulse sequentially to the transmission gates. A timing and width of the control pulse(s) are configured to close the transmission gates in advance of a state transition of the signal at inputs of corresponding repeaters of the transmission gates, and to open the transmission gates subsequent to the state transition of the signal at outputs of the corresponding repeaters.

The control circuit may comprise a number of repeaters that is the same as a number of repeaters along the transmission line. The signal propagation delay through the repeaters on the control circuit may be matched (i.e., made equal to, within design tolerance) to a propagation delay of the repeaters on the transmission line when CMS mode is enabled. The propagation delay matching between control line and data line is enabled when the data line has transient CMS mode activated; otherwise, the control line propagates signals faster than the data line.

FIG. 3 depicts a signal transmission path in one embodiment. The signal transmission path comprises a plurality of transmission gates 302, each configured with an input-to-output path comprising a signal repeater 304. The repeaters may invert the signal as it passes from input to output. Responsive to an enabling input signal, any particular transmission gate 302 either enables propagation of a signal between the input and output of the corresponding transmission gate 302, or else creates an effectively open circuit between the input and output. Many types of transmission gates operable as switches are suitable for this purpose and are known in the art. In one embodiment the transmission gates 302 are formed with low driver strength so as not to introduce too much loading into the signal transmission path.

FIG. 4 depicts exemplary scenarios for use of an interconnect or fabric 404 in a circuit system 406 in accordance with some embodiments. A circuit system 406 may be utilized between circuits 402, 408 in a computing system 410, a vehicle 412, and a robot 414, to name just a few examples.

Figure 5:
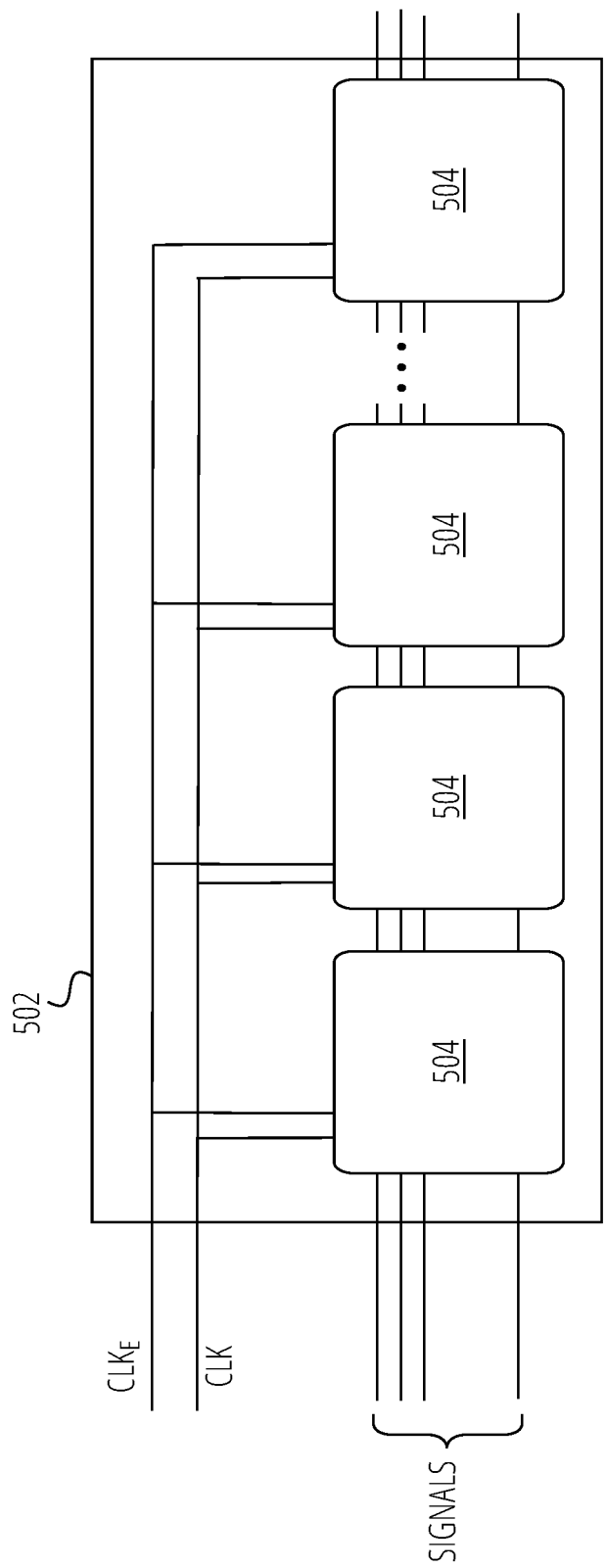
FIG. 5 depicts a signaling interconnect 502 in one embodiment.

FIG. 5 depicts a signaling interconnect 502 in one embodiment. Two clock signals, CLK and $CLK_E$, are utilized to control the propagation of a plurality of signals through a plurality of signal transmission stages 504. The two clock signals are phase shifted from one another, e.g., the pulses of $CLK_E$ may be generated somewhat earlier than the pulses of CLK.

Figure 6:
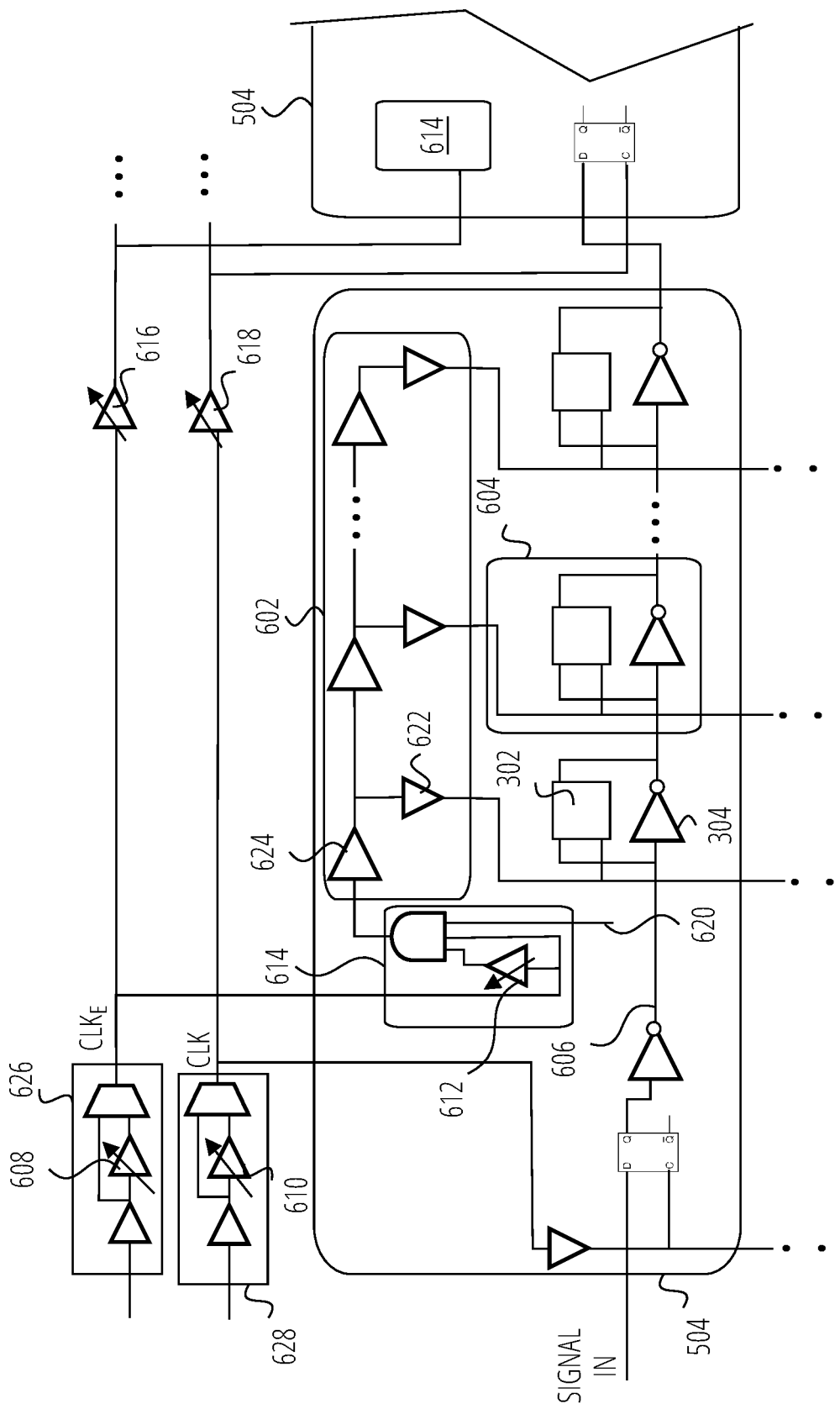
FIG. 6 depicts a signal transmission path ("transmission line") in one embodiment.

FIG. 6 depicts a signal transmission path (i.e., transmission line) in one embodiment. The transmission line comprises signal transmission stages 504, each comprising a control circuit 602 for multiple repeater stages 604 along the signal transmission path 606. The transmission line utilizes an adjustable delay element 608, adjustable delay element 610, and an adjustable delay element 612 to control the timing of two clock signals and thereby control the relative timing of a transmitted signal and a pulse to the control circuit 602 generated by a pulse generator 614. An adjustable delay element 616 and an adjustable delay element 618 may be utilized to control the timing of the clock signals to later stages.

The pulse generator 614 generates a pulse with a width determined by the clock pulse $CLK_E$ (generated by clock pulse generator 626) and a delayed version of the $CLK_E$ pulse, where the delay and thus the pulse width and timing are configurable using adjustable delay element 612. The timing (and also potentially the pulse width) is/are also determined by the CMS-mode enable 620 signal.

FIG. 6 depicts an embodiment of a transmission line operable in a transient CMS-mode. A clock signal $CLK_E$ with an adjustable time offset relative to the signal clock CLK (generated by clock pulse generator 628) is applied to trigger a control pulse from the pulse generator 614. This pulse is generated before the transmitted signal transitions in state, e.g., from logical 1 to logical 0. The pulse has tunable width, and is locally generated by the pulse generator 614 at the input to the first repeater stage 604 of the transmission line. To apply the pulse to successive repeaters, a control circuit 602 is shared among multiple signal transmission paths 606 of the signal transmission stages 504. At each repeater stage, a fanout driver 622 applies the pulse to the repeaters on each of the signal transmission paths. See FIG. 3 for a depiction of the multiple signal transmission paths; only a single signal transmission path 606 is depicted in FIG. 6 for simplicity.

The control circuit 602 is configured to transmit the pulse generated by the pulse generator 614 in VMS mode. The intrinsic propagation delays of the pulse repeaters 624 and signal repeaters 304 may be matched, however the signal transmission path 606 of the control circuit 602 may be constructed to comprise lower delay (faster signal propagation) and wider metal width and/or spacing than the signal transmission path 606. Therefore the pulse propagating along the control circuit 602 to control the various repeater stages 604 matches the signal propagation on the signal transmission path 606 during CMS-mode transmission of signals on the signal transmission path 606. It runs ahead of the propagating signals when the signal transmission path 606 is operated in VMS mode. The pulse width and pulse offset are both tunable in this embodiment providing operational flexibility to account for data and PVT (process, voltage, and/or temperature) variations.

As the pulse propagates along the control circuit 602, signal state propagates from one repeater stage 604 to another, and is isolated (maintained) at prior repeater stages 604 until a next signal transition is clocked onto the signal transmission path 606, at which time another pulse is generated to 'guide' the second transition through the repeater stages 604 along the signal transmission path 606. Each pulse arrives at the transmission gate for a repeater stage slightly ahead of the signal transition, providing a 'head start' on the transition across the repeater. If the pulse arrives too early or too late, charge may flow back and forth inefficiently across the repeater, and if the pulse is too wide, the signal transition may be flattened, even to the point of being lost altogether. The various delay elements may be tuned to generate a pulse at a time and with a duration that avoids these drawbacks while capturing the benefits of CMS-mode operation.

During a time when the pulse is not applied at the transmission gate 302, the power-efficient VMS-mode transmission line charge preserving scenario depicted in FIG. 1A is enabled. When the pulse is received at the transmission gate 302 slightly ahead of the signal transition, it enables the fast, full-swing CMS-mode transmission line charge and discharge scenarios depicted in FIG. 2A and FIG. 2B.

The width of the pulse generated by the pulse generator 614 may be tuned to fall within a window (neither be too wide nor too narrow). A pulse width that is too wide may urge operation toward an always-on CMS mode, incurring more of the drawbacks of CMS. For example signal recovery and power consumption may be negatively impacted by a pulse width that is set too wide. A pulse width that is set too narrow may urge operation toward VMS mode, incurring more of the drawbacks thereof.

The pulse offset may also be tuned within a window. When the pulse offset is too early or too late, greater power consumption may result, and assistance to the data transition may be reduced or lost. The tunability of pulse width and offset also provide more coverage for data and PVT variations.

As noted previously in conjunction with FIG. 3, signaling interconnects may comprise a large number of signal transmission paths 606. The control pulse may be configured via the various delay elements to account both the slowest and fastest path in the fabric for different PVT corner cases. The delay element settings may for example be determined by simulating the signal transmission behavior of a fabric at and/or between various (e.g., slow and fast) process corners, and/or by testing after manufacture. Configuration of the delay elements may first be made to ensure proper functionality over the expected PVT range, followed by finer tuning to improve performance, and additional fine tuning for reduced power consumption. For example, as an initial configuration, both of the pulse width and the pulse offset (from CLK pulses) may be configured to achieve an optimum (within design constraints) performance boost from transient CMS-mode operation.

The adjustable delay element 616 and the adjustable delay element 618 may be utilized to control the timing of the clock signals to later stages. For example the adjustable delay element 616 and adjustable delay element 618 may be configured to compensate for drift in the timing and/or phase of the two clock signals at subsequent stages. Selection circuits (e.g., multiplexers as depicted) may be utilized to select one or both of either the original CLK and $CLK_E$ signals for propagation to the later stages, or else one or both of the delayed versions of these signals.

Increasing the speed of fabric transmission paths improves latency and throughput. Additionally, as noted prior, a reduction in repeaters and flops/latches along the transmission paths may be achieved. These efficiencies further contribute to a reduction in total power and area.

Figure 7:
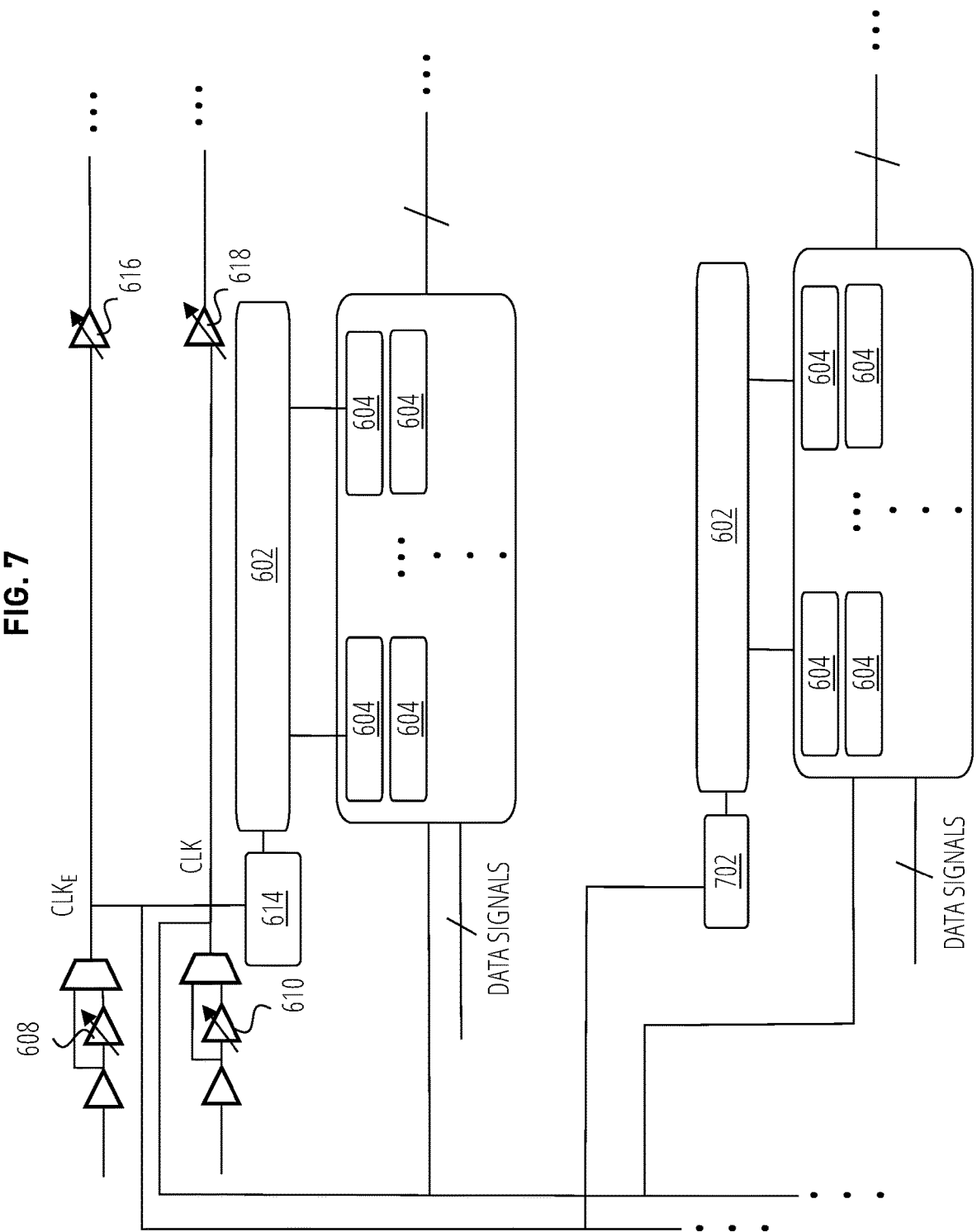
FIG. 7 and FIG. 8 depict alternate embodiments of a signaling interconnect.
Figure 8:
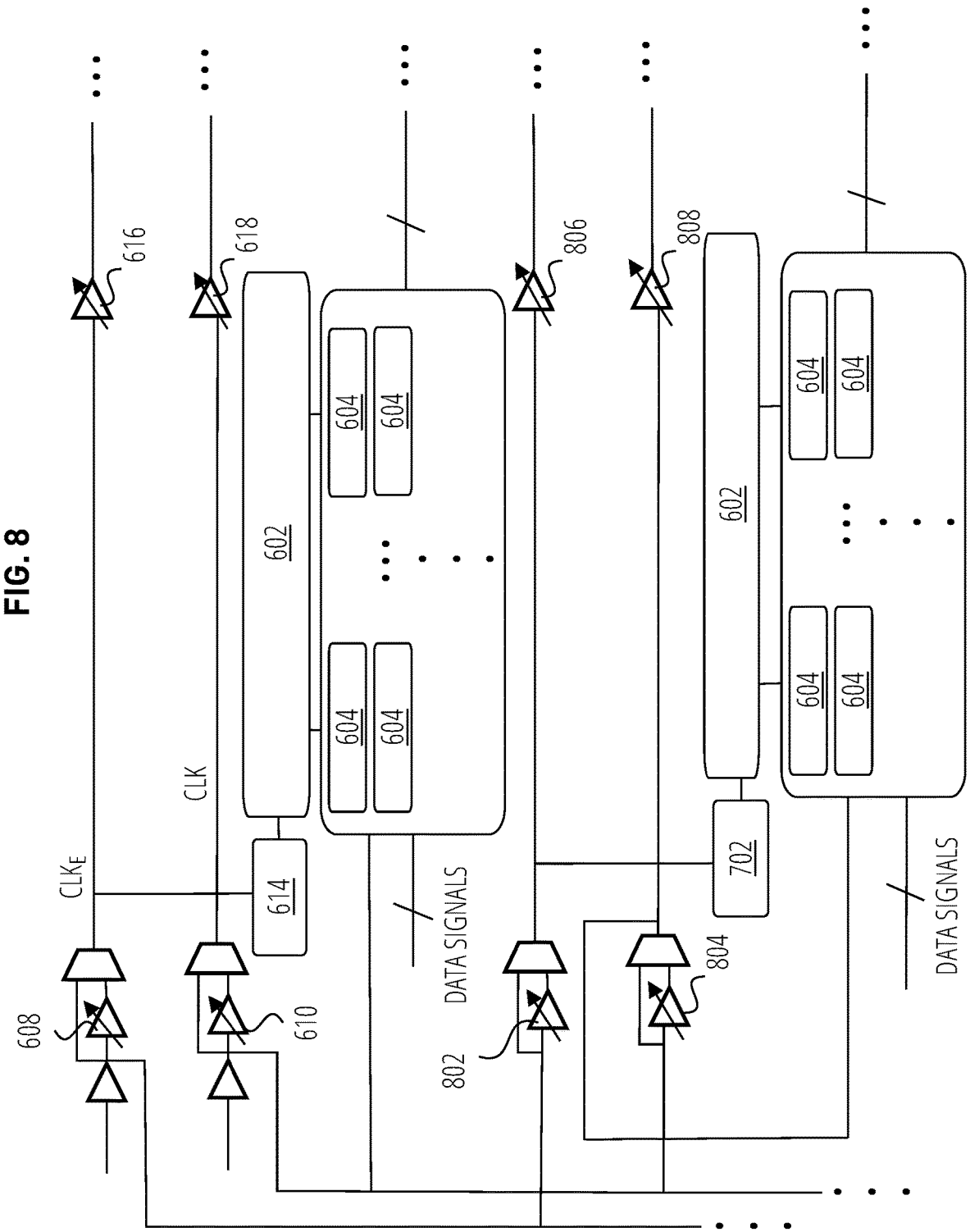

FIG. 7 and FIG. 8 depict alternate embodiments in which distinct pulse generator circuits pulse generator 614, pulse generator 702 etc., and duplicate control circuit 602 are dedicated to different sub-groups of signal lines. The pulse generators may be individually configured to generate control pulses with width and timing most suited to the signal transmission paths in their group. Within an extensive signaling fabric, this provides a tradeoff between area and power consumption, and tailoring of the control pulse width to different areas of the fabric. Generally, area and power consumption of pulse generator 614 logic and the control circuits 602 may be amortized across all signal paths, or sub-groups of signal paths. FIG. 8 depict an embodiment that includes not only multiple pulse generators but also adjustable clock delay elements (adjustable delay element 802, adjustable delay element 804, adjustable delay element 806, adjustable delay element 808 etc.) that vary for different areas of a signaling fabric.

Figure 9A:
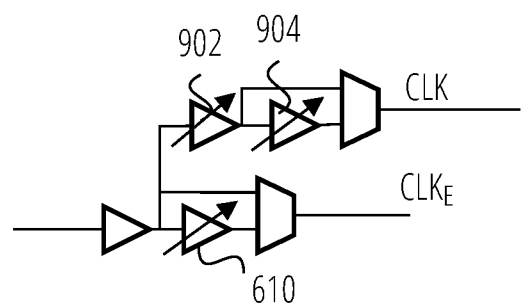
FIG. 9A and FIG. 9B depict alternate embodiments of clocking circuits.
Figure 9B:
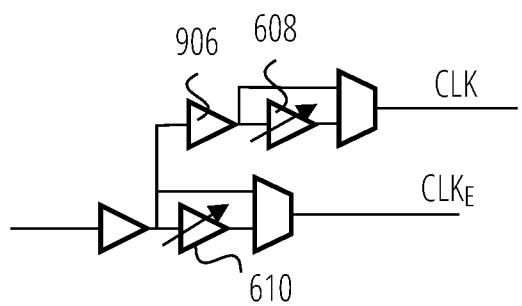

FIG. 9A and FIG. 9B depict alternate embodiments for generation of the CLK and $CLK_E$ signals. A clock utilized for CLK may be phase adjusted via a coarse delay adjustment element 902 and a fine delay adjustment element 904 (FIG. 9A), or CLK may be generated by applying a fixed delay element 906 followed by an adjustable delay element 608.

The circuits disclosed herein may be utilized by computing devices that include one or more graphic processing unit (GPU) and/or general purpose data processor (e.g., a 'central processing unit or CPU). Exemplary computing platforms will now be described that incorporate the circuits disclosed herein in or with their interconnects and/or fabrics.

The following description may use certain acronyms and abbreviations as follows:
  "DPC" refers to a "data processing cluster";
  "GPC" refers to a "general processing cluster";
  "I/O" refers to a "input/output";
  "L1 cache" refers to "level one cache";
  "L2 cache" refers to "level two cache";
  "LSU" refers to a "load/store unit";
  "MMU" refers to a "memory management unit";
  "MPC" refers to an "M-pipe controller";
  "PPU" refers to a "parallel processing unit";
  "PROP" refers to a "pre-raster operations unit";
  "ROP" refers to a "raster operations";
  "SFU" refers to a "special function unit";
  "SM" refers to a "streaming multiprocessor";
  "Viewport SCC" refers to "viewport scale, cull, and clip";
  "WDX" refers to a "work distribution crossbar"; and
  "XBar" refers to a "crossbar".

Parallel Processing Unit

Figure 10:
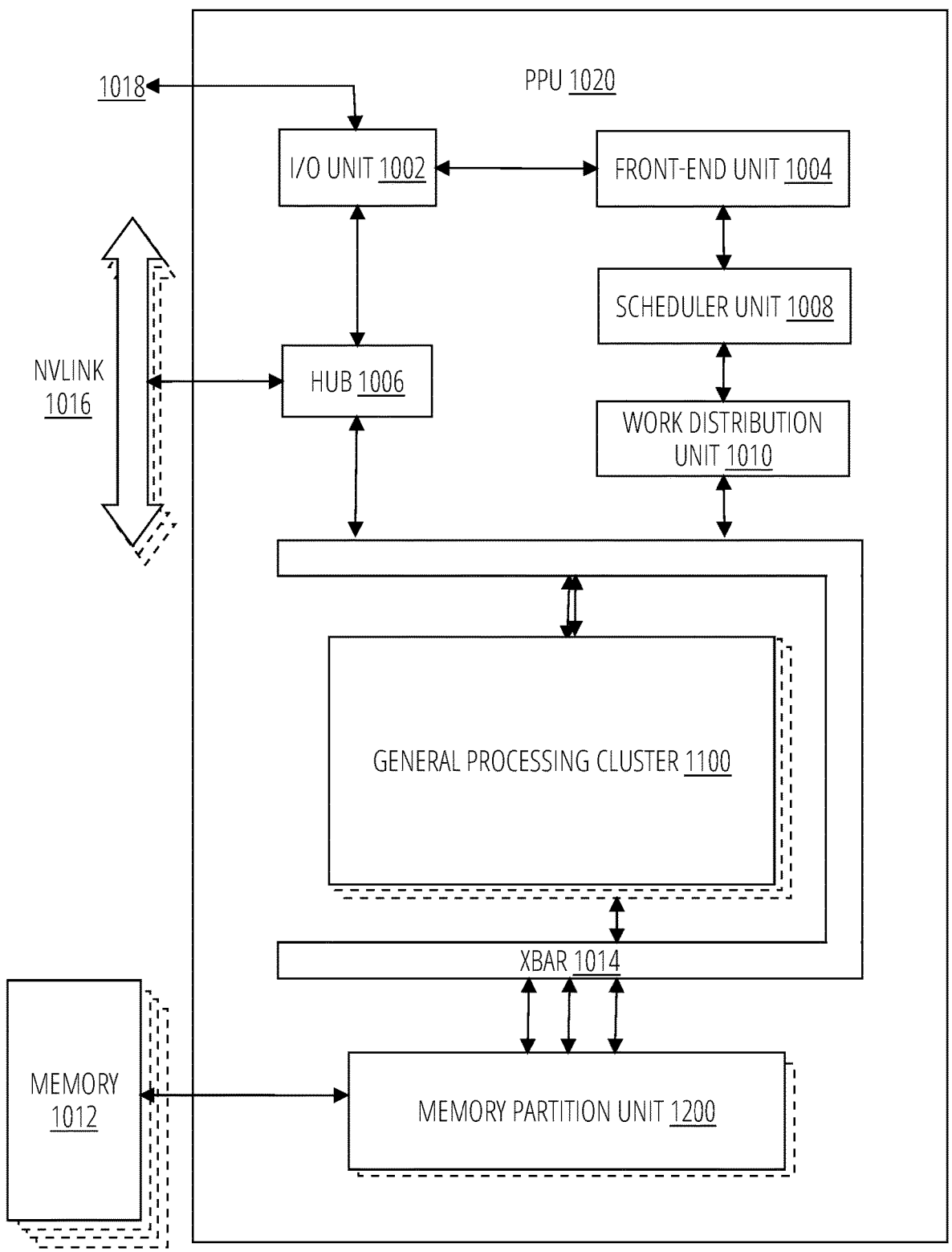
FIG. 10 depicts a parallel processing unit 1020 in accordance with one embodiment.

FIG. 10 depicts a parallel processing unit 1020, in accordance with an embodiment. In an embodiment, the parallel processing unit 1020 is a multi-threaded processor that is implemented on one or more integrated circuit devices. The parallel processing unit 1020 is a latency hiding architecture designed to process many threads in parallel. A thread (e.g., a thread of execution) is an instantiation of a set of instructions configured to be executed by the parallel processing unit 1020. In an embodiment, the parallel processing unit 1020 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 1020 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 1020 modules may be configured to accelerate thousands of High Performance Computing (HPC), data center, and machine learning applications. The parallel processing unit 1020 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 10, the parallel processing unit 1020 includes an I/O unit 1002, a front-end unit 1004, a scheduler unit 1008, a work distribution unit 1010, a hub 1006, a crossbar 1014, one or more general processing cluster 1100 modules, and one or more memory partition unit 1200 modules. The parallel processing unit 1020 may be connected to a host processor or other parallel processing unit 1020 modules via one or more high-speed NVLink 1016 interconnects. The parallel processing unit 1020 may be connected to a host processor or other peripheral devices via an interconnect 1018. The parallel processing unit 1020 may also be connected to a local memory comprising a number of memory 1012 devices. In an embodiment, the local memory may comprise a number of dynamic random access memory (DRAM) devices. The DRAM devices may be configured as a high-bandwidth memory (HBM) subsystem, with multiple DRAM dies stacked within each device. The memory 1012 may comprise logic to configure the parallel processing unit 1020 to carry out aspects of the techniques disclosed herein.

The NVLink 1016 interconnect enables systems to scale and include one or more parallel processing unit 1020 modules combined with one or more CPUs, supports cache coherence between the parallel processing unit 1020 modules and CPUs, and CPU mastering. Data and/or commands may be transmitted by the NVLink 1016 through the hub 1006 to/from other units of the parallel processing unit 1020 such as one or more copy engines, a video encoder, a video decoder, a power management unit, etc. (not explicitly shown). The NVLink 1016 is described in more detail in conjunction with FIG. 14.

The I/O unit 1002 is configured to transmit and receive communications (e.g., commands, data, etc.) from a host processor (not shown) over the interconnect 1018. The I/O unit 1002 may communicate with the host processor directly via the interconnect 1018 or through one or more intermediate devices such as a memory bridge. In an embodiment, the I/O unit 1002 may communicate with one or more other processors, such as one or more parallel processing unit 1020 modules via the interconnect 1018. In an embodiment, the I/O unit 1002 implements a Peripheral Component Interconnect Express (PCIe) interface for communications over a PCIe bus and the interconnect 1018 is a PCIe bus. In alternative embodiments, the I/O unit 1002 may implement other types of well-known interfaces for communicating with external devices.

The I/O unit 1002 decodes packets received via the interconnect 1018. In an embodiment, the packets represent commands configured to cause the parallel processing unit 1020 to perform various operations. The I/O unit 1002 transmits the decoded commands to various other units of the parallel processing unit 1020 as the commands may specify. For example, some commands may be transmitted to the front-end unit 1004. Other commands may be transmitted to the hub 1006 or other units of the parallel processing unit 1020 such as one or more copy engines, a video encoder, a video decoder, a power management unit, etc. (not explicitly shown). In other words, the I/O unit 1002 is configured to route communications between and among the various logical units of the parallel processing unit 1020.

In an embodiment, a program executed by the host processor encodes a command stream in a buffer that provides workloads to the parallel processing unit 1020 for processing. A workload may comprise several instructions and data to be processed by those instructions. The buffer is a region in a memory that is accessible (e.g., read/write) by both the host processor and the parallel processing unit 1020. For example, the I/O unit 1002 may be configured to access the buffer in a system memory connected to the interconnect 1018 via memory requests transmitted over the interconnect 1018. In an embodiment, the host processor writes the command stream to the buffer and then transmits a pointer to the start of the command stream to the parallel processing unit 1020. The front-end unit 1004 receives pointers to one or more command streams. The front-end unit 1004 manages the one or more streams, reading commands from the streams and forwarding commands to the various units of the parallel processing unit 1020.

The front-end unit 1004 is coupled to a scheduler unit 1008 that configures the various general processing cluster 1100 modules to process tasks defined by the one or more streams. The scheduler unit 1008 is configured to track state information related to the various tasks managed by the scheduler unit 1008. The state may indicate which general processing cluster 1100 a task is assigned to, whether the task is active or inactive, a priority level associated with the task, and so forth. The scheduler unit 1008 manages the execution of a plurality of tasks on the one or more general processing cluster 1100 modules.

The scheduler unit 1008 is coupled to a work distribution unit 1010 that is configured to dispatch tasks for execution on the general processing cluster 1100 modules. The work distribution unit 1010 may track a number of scheduled tasks received from the scheduler unit 1008. In an embodiment, the work distribution unit 1010 manages a pending task pool and an active task pool for each of the general processing cluster 1100 modules. The pending task pool may comprise a number of slots (e.g., 32 slots) that contain tasks assigned to be processed by a particular general processing cluster 1100. The active task pool may comprise a number of slots (e.g., 4 slots) for tasks that are actively being processed by the general processing cluster 1100 modules.

As a general processing cluster 1100 finishes the execution of a task, that task is evicted from the active task pool for the general processing cluster 1100 and one of the other tasks from the pending task pool is selected and scheduled for execution on the general processing cluster 1100. If an active task has been idle on the general processing cluster 1100, such as while waiting for a data dependency to be resolved, then the active task may be evicted from the general processing cluster 1100 and returned to the pending task pool while another task in the pending task pool is selected and scheduled for execution on the general processing cluster 1100.

The work distribution unit 1010 communicates with the one or more general processing cluster 1100 modules via crossbar 1014. The crossbar 1014 is an interconnect network that couples many of the units of the parallel processing unit 1020 to other units of the parallel processing unit 1020. For example, the crossbar 1014 may be configured to couple the work distribution unit 1010 to a particular general processing cluster 1100. Although not shown explicitly, one or more other units of the parallel processing unit 1020 may also be connected to the crossbar 1014 via the hub 1006.

The tasks are managed by the scheduler unit 1008 and dispatched to a general processing cluster 1100 by the work distribution unit 1010. The general processing cluster 1100 is configured to process the task and generate results. The results may be consumed by other tasks within the general processing cluster 1100, routed to a different general processing cluster 1100 via the crossbar 1014, or stored in the memory 1012. The results can be written to the memory 1012 via the memory partition unit 1200 modules, which implement a memory interface for reading and writing data to/from the memory 1012. The results can be transmitted to another parallel processing unit 1020 or CPU via the NVLink 1016. In an embodiment, the parallel processing unit 1020 includes a number U of memory partition unit 1200 modules that is equal to the number of separate and distinct memory 1012 devices coupled to the parallel processing unit 1020. A memory partition unit 1200 will be described in more detail below in conjunction with FIG. 12.

In an embodiment, a host processor executes a driver kernel that implements an application programming interface (API) that enables one or more applications executing on the host processor to schedule operations for execution on the parallel processing unit 1020. In an embodiment, multiple compute applications are simultaneously executed by the parallel processing unit 1020 and the parallel processing unit 1020 provides isolation, quality of service (QoS), and independent address spaces for the multiple compute applications. An application may generate instructions (e.g., API calls) that cause the driver kernel to generate one or more tasks for execution by the parallel processing unit 1020. The driver kernel outputs tasks to one or more streams being processed by the parallel processing unit 1020. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 13.

Figure 11:
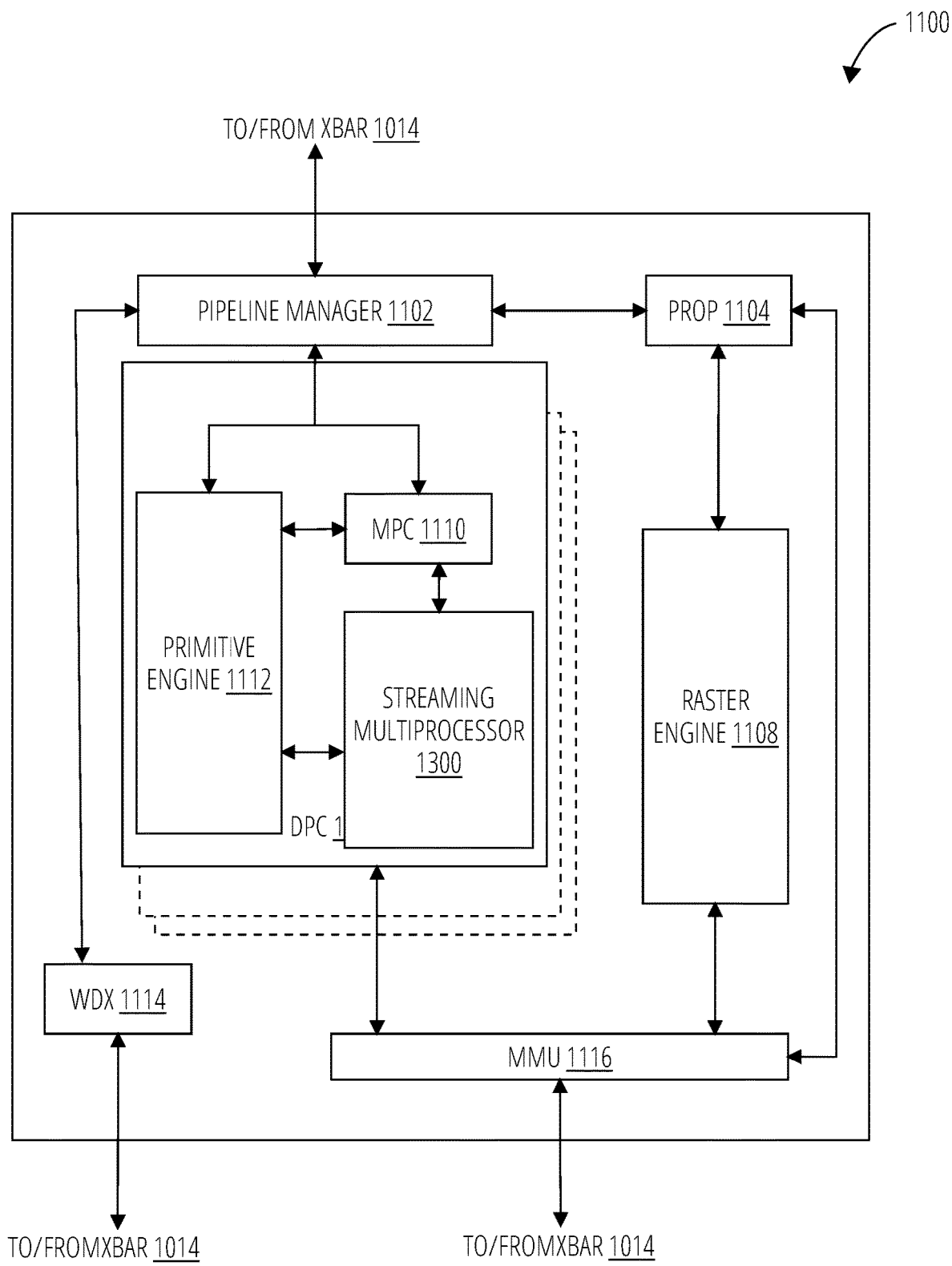
FIG. 11 depicts a general processing cluster 1100 in accordance with one embodiment.

FIG. 11 depicts a general processing cluster 1100 of the parallel processing unit 1020 of FIG. 10, in accordance with an embodiment. As shown in FIG. 11, each general processing cluster 1100 includes a number of hardware units for processing tasks. In an embodiment, each general processing cluster 1100 includes a pipeline manager 1102, a pre-raster operations unit 1104, a raster engine 1108, a work distribution crossbar 1114, a memory management unit 1116, and one or more data processing cluster 1106. It will be appreciated that the general processing cluster 1100 of FIG. 11 may include other hardware units in lieu of or in addition to the units shown in FIG. 11.

In an embodiment, the operation of the general processing cluster 1100 is controlled by the pipeline manager 1102. The pipeline manager 1102 manages the configuration of the one or more data processing cluster 1106 modules for processing tasks allocated to the general processing cluster 1100. In an embodiment, the pipeline manager 1102 may configure at least one of the one or more data processing cluster 1106 modules to implement at least a portion of a graphics rendering pipeline. For example, a data processing cluster 1106 may be configured to execute a vertex shader program on the programmable streaming multiprocessor 1300. The pipeline manager 1102 may also be configured to route packets received from the work distribution unit 1010 to the appropriate logical units within the general processing cluster 1100. For example, some packets may be routed to fixed function hardware units in the pre-raster operations unit 1104 and/or raster engine 1108 while other packets may be routed to the data processing cluster 1106 modules for processing by the primitive engine 1112 or the streaming multiprocessor 1300. In an embodiment, the pipeline manager 1102 may configure at least one of the one or more data processing cluster 1106 modules to implement a neural network model and/or a computing pipeline.

Figure 12:
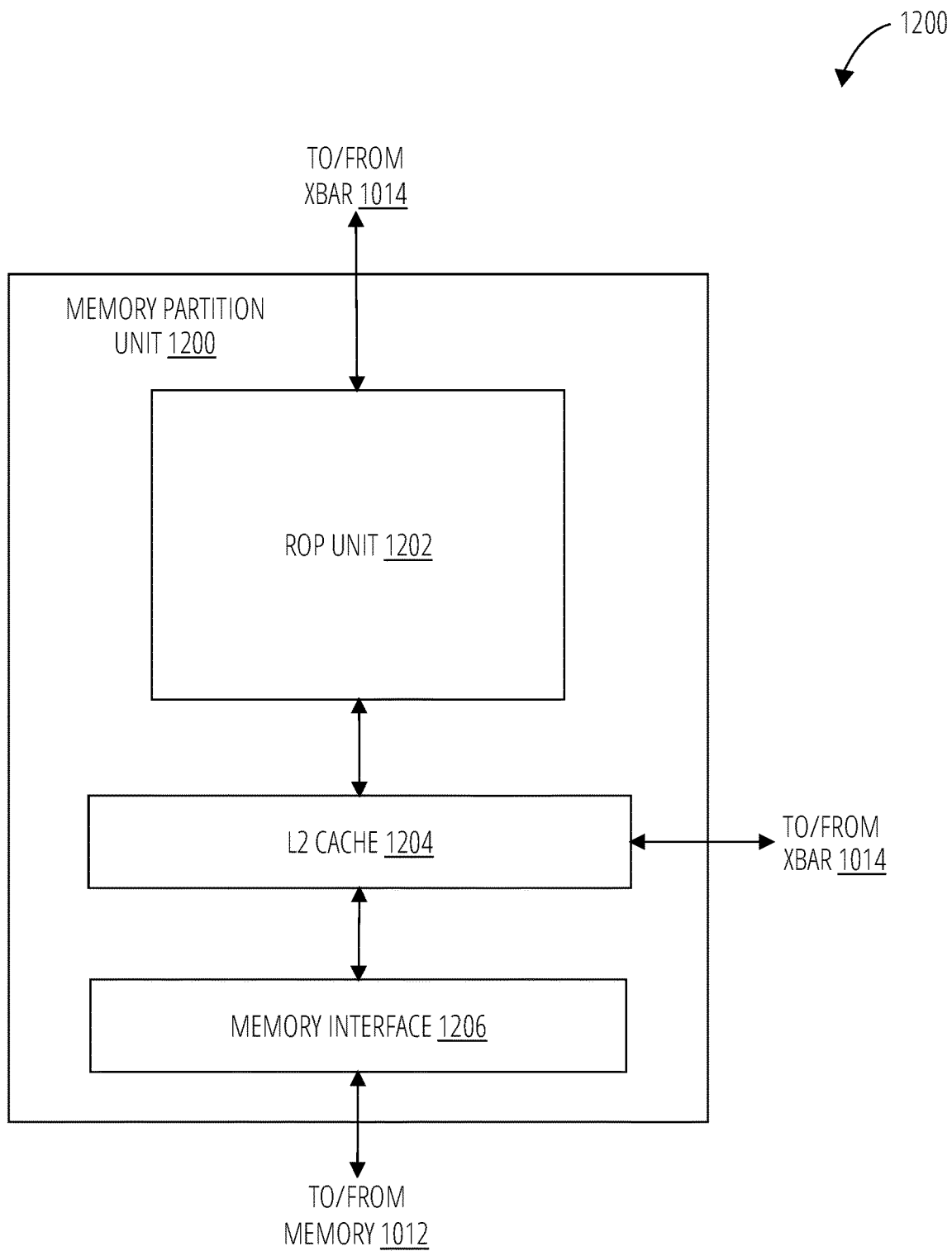
FIG. 12 depicts a memory partition unit 1200 in accordance with one embodiment.

The pre-raster operations unit 1104 is configured to route data generated by the raster engine 1108 and the data processing cluster 1106 modules to a Raster Operations (ROP) unit, described in more detail in conjunction with FIG. 12. The pre-raster operations unit 1104 may also be configured to perform optimizations for color blending, organize pixel data, perform address translations, and the like.

The raster engine 1108 includes a number of fixed function hardware units configured to perform various raster operations. In an embodiment, the raster engine 1108 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 1108 comprises fragments to be processed, for example, by a fragment shader implemented within a data processing cluster 1106.

Each data processing cluster 1106 included in the general processing cluster 1100 includes an M-pipe controller 1110, a primitive engine 1112, and one or more streaming multiprocessor 1300 modules. The M-pipe controller 1110 controls the operation of the data processing cluster 1106, routing packets received from the pipeline manager 1102 to the appropriate units in the data processing cluster 1106. For example, packets associated with a vertex may be routed to the primitive engine 1112, which is configured to fetch vertex attributes associated with the vertex from the memory 1012. In contrast, packets associated with a shader program may be transmitted to the streaming multiprocessor 1300.

The streaming multiprocessor 1300 comprises a programmable streaming processor that is configured to process tasks represented by a number of threads. Each streaming multiprocessor 1300 is multi-threaded and configured to execute a plurality of threads (e.g., 32 threads) from a particular group of threads concurrently. In an embodiment, the streaming multiprocessor 1300 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the streaming multiprocessor 1300 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The streaming multiprocessor 1300 will be described in more detail below in conjunction with FIG. 13.

The memory management unit 1116 provides an interface between the general processing cluster 1100 and the memory partition unit 1200. The memory management unit 1116 may provide translation of virtual addresses into physical addresses, memory protection, and arbitration of memory requests. In an embodiment, the memory management unit 1116 provides one or more translation lookaside buffers (TLBs) for performing translation of virtual addresses into physical addresses in the memory 1012.

FIG. 12 depicts a memory partition unit 1200 of the parallel processing unit 1020 of FIG. 10, in accordance with an embodiment. As shown in FIG. 12, the memory partition unit 1200 includes a raster operations unit 1202, a level two cache 1204, and a memory interface 1206. The memory interface 1206 is coupled to the memory 1012. Memory interface 1206 may implement 32, 64, 128, 1024-bit data buses, or the like, for high-speed data transfer. In an embodiment, the parallel processing unit 1020 incorporates U memory interface 1206 modules, one memory interface 1206 per pair of memory partition unit 1200 modules, where each pair of memory partition unit 1200 modules is connected to a corresponding memory 1012 device. For example, parallel processing unit 1020 may be connected to up to Y memory 1012 devices, such as high bandwidth memory stacks or graphics double-data-rate, version 5, synchronous dynamic random access memory, or other types of persistent storage.

In an embodiment, the memory interface 1206 implements an HBM2 memory interface and Y equals half U. In an embodiment, the HBM2 memory stacks are located on the same physical package as the parallel processing unit 1020, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 1012 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 1020 modules process very large datasets and/or run applications for extended periods.

In an embodiment, the parallel processing unit 1020 implements a multi-level memory hierarchy. In an embodiment, the memory partition unit 1200 supports a unified memory to provide a single unified virtual address space for CPU and parallel processing unit 1020 memory, enabling data sharing between virtual memory systems. In an embodiment the frequency of accesses by a parallel processing unit 1020 to memory located on other processors is traced to ensure that memory pages are moved to the physical memory of the parallel processing unit 1020 that is accessing the pages more frequently. In an embodiment, the NVLink 1016 supports address translation services allowing the parallel processing unit 1020 to directly access a CPU's page tables and providing full access to CPU memory by the parallel processing unit 1020.

In an embodiment, copy engines transfer data between multiple parallel processing unit 1020 modules or between parallel processing unit 1020 modules and CPUs. The copy engines can generate page faults for addresses that are not mapped into the page tables. The memory partition unit 1200 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 1012 or other system memory may be fetched by the memory partition unit 1200 and stored in the level two cache 1204, which is located on-chip and is shared between the various general processing cluster 1100 modules. As shown, each memory partition unit 1200 includes a portion of the level two cache 1204 associated with a corresponding memory 1012 device. Lower level caches may then be implemented in various units within the general processing cluster 1100 modules. For example, each of the streaming multiprocessor 1300 modules may implement an L1 cache. The L1 cache is private memory that is dedicated to a particular streaming multiprocessor 1300. Data from the level two cache 1204 may be fetched and stored in each of the L1 caches for processing in the functional units of the streaming multiprocessor 1300 modules. The level two cache 1204 is coupled to the memory interface 1206 and the crossbar 1014.

The raster operations unit 1202 performs graphics raster operations related to pixel color, such as color compression, pixel blending, and the like. The raster operations unit 1202 also implements depth testing in conjunction with the raster engine 1108, receiving a depth for a sample location associated with a pixel fragment from the culling engine of the raster engine 1108. The depth is tested against a corresponding depth in a depth buffer for a sample location associated with the fragment. If the fragment passes the depth test for the sample location, then the raster operations unit 1202 updates the depth buffer and transmits a result of the depth test to the raster engine 1108. It will be appreciated that the number of partition memory partition unit 1200 modules may be different than the number of general processing cluster 1100 modules and, therefore, each raster operations unit 1202 may be coupled to each of the general processing cluster 1100 modules. The raster operations unit 1202 tracks packets received from the different general processing cluster 1100 modules and determines which general processing cluster 1100 that a result generated by the raster operations unit 1202 is routed to through the crossbar 1014. Although the raster operations unit 1202 is included within the memory partition unit 1200 in FIG. 12, in other embodiment, the raster operations unit 1202 may be outside of the memory partition unit 1200. For example, the raster operations unit 1202 may reside in the general processing cluster 1100 or another unit.

Figure 13:
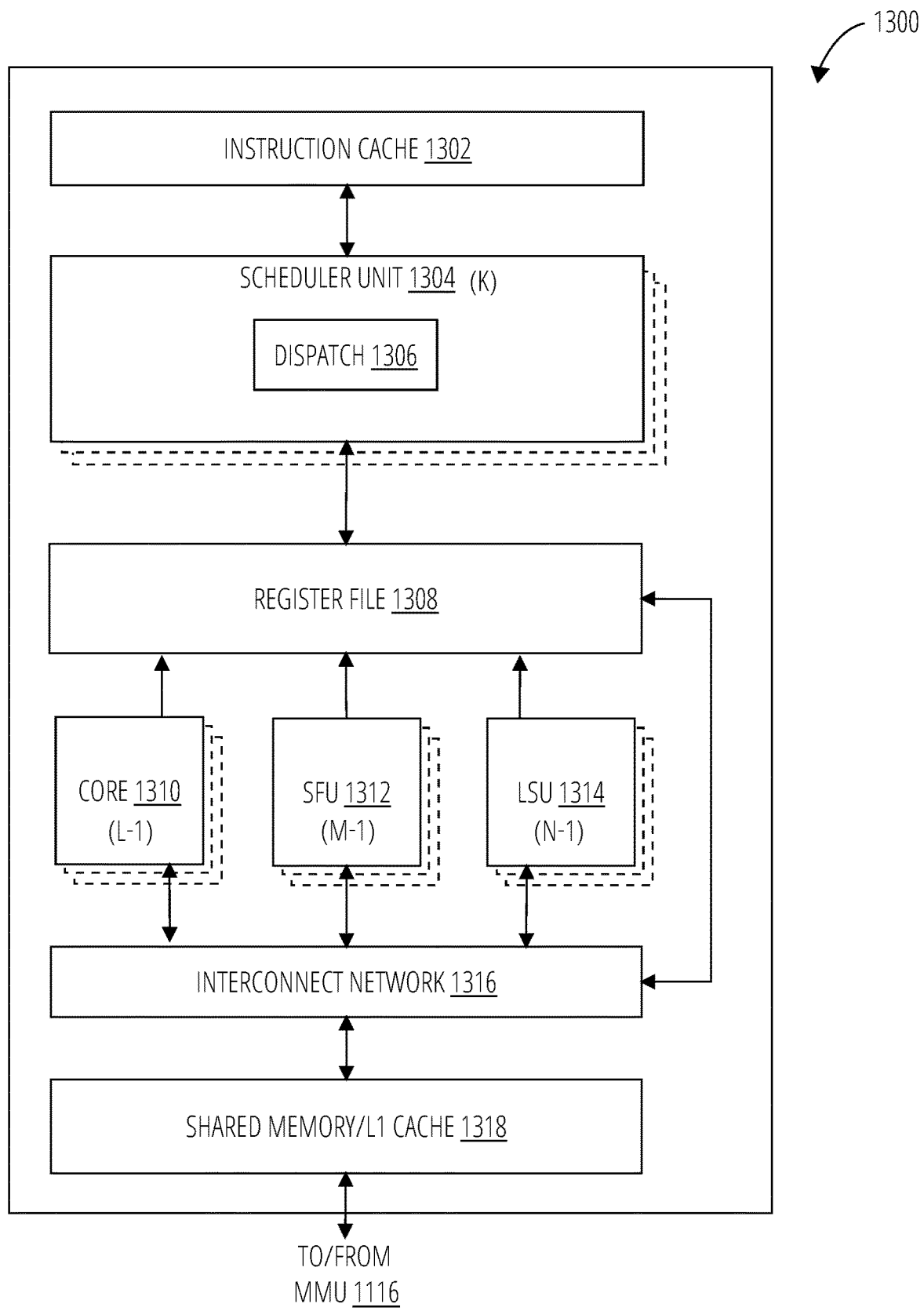
FIG. 13 depicts a streaming multiprocessor 1300 in accordance with one embodiment.

FIG. 13 illustrates the streaming multiprocessor 1300 of FIG. 11, in accordance with an embodiment. As shown in FIG. 13, the streaming multiprocessor 1300 includes an instruction cache 1302, one or more scheduler unit 1304 modules (e.g., such as scheduler unit 1008), a register file 1308, one or more processing core 1310 modules, one or more special function unit 1312 modules, one or more load/store unit 1314 modules, an interconnect network 1316, and a shared memory/L1 cache 1318.

As described above, the work distribution unit 1010 dispatches tasks for execution on the general processing cluster 1100 modules of the parallel processing unit 1020. The tasks are allocated to a particular data processing cluster 1106 within a general processing cluster 1100 and, if the task is associated with a shader program, the task may be allocated to a streaming multiprocessor 1300. The scheduler unit 1008 receives the tasks from the work distribution unit 1010 and manages instruction scheduling for one or more thread blocks assigned to the streaming multiprocessor 1300. The scheduler unit 1304 schedules thread blocks for execution as warps of parallel threads, where each thread block is allocated at least one warp. In an embodiment, each warp executes 32 threads. The scheduler unit 1304 may manage a plurality of different thread blocks, allocating the warps to the different thread blocks and then dispatching instructions from the plurality of different cooperative groups to the various functional units (e.g., core 1310 modules, special function unit 1312 modules, and load/store unit 1314 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 1306 unit is configured within the scheduler unit 1304 to transmit instructions to one or more of the functional units. In one embodiment, the scheduler unit 1304 includes two dispatch 1306 units that enable two different instructions from the same warp to be dispatched during each clock cycle. In alternative embodiments, each scheduler unit 1304 may include a single dispatch 1306 unit or additional dispatch 1306 units.

Each streaming multiprocessor 1300 includes a register file 1308 that provides a set of registers for the functional units of the streaming multiprocessor 1300. In an embodiment, the register file 1308 is divided between each of the functional units such that each functional unit is allocated a dedicated portion of the register file 1308. In another embodiment, the register file 1308 is divided between the different warps being executed by the streaming multiprocessor 1300. The register file 1308 provides temporary storage for operands connected to the data paths of the functional units.

Each streaming multiprocessor 1300 comprises L processing core 1310 modules. In an embodiment, the streaming multiprocessor 1300 includes a large number (e.g., 128, etc.) of distinct processing core 1310 modules. Each core 1310 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 1310 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 1310 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each streaming multiprocessor 1300 also comprises M special function unit 1312 modules that perform special functions (e.g., attribute evaluation, reciprocal square root, and the like). In an embodiment, the special function unit 1312 modules may include a tree traversal unit configured to traverse a hierarchical tree data structure. In an embodiment, the special function unit 1312 modules may include texture unit configured to perform texture map filtering operations. In an embodiment, the texture units are configured to load texture maps (e.g., a 2D array of texels) from the memory 1012 and sample the texture maps to produce sampled texture values for use in shader programs executed by the streaming multiprocessor 1300. In an embodiment, the texture maps are stored in the shared memory/L1 cache 1318. The texture units implement texture operations such as filtering operations using mip-maps (e.g., texture maps of varying levels of detail). In an embodiment, each streaming multiprocessor 1300 includes two texture units.

Each streaming multiprocessor 1300 also comprises N load/store unit 1314 modules that implement load and store operations between the shared memory/L1 cache 1318 and the register file 1308. Each streaming multiprocessor 1300 includes an interconnect network 1316 that connects each of the functional units to the register file 1308 and the load/store unit 1314 to the register file 1308 and shared memory/L1 cache 1318. In an embodiment, the interconnect network 1316 is a crossbar that can be configured to connect any of the functional units to any of the registers in the register file 1308 and connect the load/store unit 1314 modules to the register file 1308 and memory locations in shared memory/L1 cache 1318.

The shared memory/L1 cache 1318 is an array of on-chip memory that allows for data storage and communication between the streaming multiprocessor 1300 and the primitive engine 1112 and between threads in the streaming multiprocessor 1300. In an embodiment, the shared memory/L1 cache 1318 comprises 128 KB of storage capacity and is in the path from the streaming multiprocessor 1300 to the memory partition unit 1200. The shared memory/L1 cache 1318 can be used to cache reads and writes. One or more of the shared memory/L1 cache 1318, level two cache 1204, and memory 1012 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1318 enables the shared memory/L1 cache 1318 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 10, are bypassed, creating a much simpler programming model. In the general purpose parallel computation configuration, the work distribution unit 1010 assigns and distributes blocks of threads directly to the data processing cluster 1106 modules. The threads in a block execute the same program, using a unique thread ID in the calculation to ensure each thread generates unique results, using the streaming multiprocessor 1300 to execute the program and perform calculations, shared memory/L1 cache 1318 to communicate between threads, and the load/store unit 1314 to read and write global memory through the shared memory/L1 cache 1318 and the memory partition unit 1200. When configured for general purpose parallel computation, the streaming multiprocessor 1300 can also write commands that the scheduler unit 1008 can use to launch new work on the data processing cluster 1106 modules.

The parallel processing unit 1020 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 1020 is embodied on a single semiconductor substrate. In another embodiment, the parallel processing unit 1020 is included in a system-on-a-chip (SoC) along with one or more other devices such as additional parallel processing unit 1020 modules, the memory 1012, a reduced instruction set computer (RISC) CPU, a memory management unit (MMU), a digital-to-analog converter (DAC), and the like.

In an embodiment, the parallel processing unit 1020 may be included on a graphics card that includes one or more memory devices. The graphics card may be configured to interface with a PCIe slot on a motherboard of a desktop computer. In yet another embodiment, the parallel processing unit 1020 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 14:
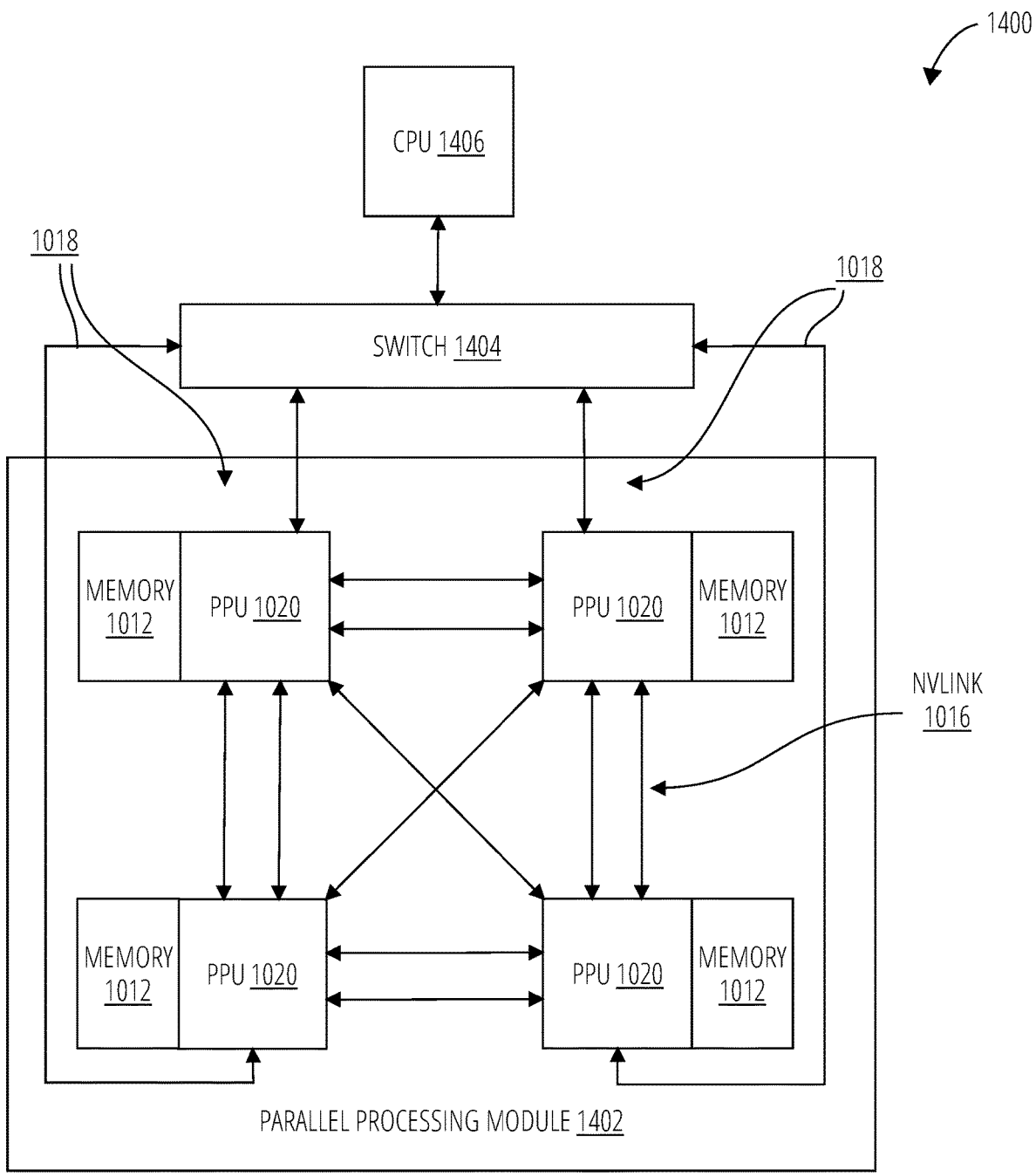
FIG. 14 depicts a processing system 1400 in accordance with one embodiment.

FIG. 14 is a conceptual diagram of a processing system 1400 implemented using the parallel processing unit 1020 of FIG. 10, in accordance with an embodiment. The processing system 1400 includes a central processing unit 1406, switch 1404, and multiple parallel processing unit 1020 modules each and respective memory 1012 modules. The NVLink 1016 provides high-speed communication links between each of the parallel processing unit 1020 modules. Although a particular number of NVLink 1016 and interconnect 1018 connections are illustrated in FIG. 14, the number of connections to each parallel processing unit 1020 and the central processing unit 1406 may vary. The switch 1404 interfaces between the interconnect 1018 and the central processing unit 1406. The parallel processing unit 1020 modules, memory 1012 modules, and NVLink 1016 connections may be situated on a single semiconductor platform to form a parallel processing module 1402. In an embodiment, the switch 1404 supports two or more protocols to interface between various different connections and/or links.

In another embodiment (not shown), the NVLink 1016 provides one or more high-speed communication links between each of the parallel processing unit modules (parallel processing unit 1020, parallel processing unit 1020, parallel processing unit 1020, and parallel processing unit 1020) and the central processing unit 1406 and the switch 1404 interfaces between the interconnect 1018 and each of the parallel processing unit modules. The parallel processing unit modules, memory 1012 modules, and interconnect 1018 may be situated on a single semiconductor platform to form a parallel processing module 1402. In yet another embodiment (not shown), the interconnect 1018 provides one or more communication links between each of the parallel processing unit modules and the central processing unit 1406 and the switch 1404 interfaces between each of the parallel processing unit modules using the NVLink 1016 to provide one or more high-speed communication links between the parallel processing unit modules. In another embodiment (not shown), the NVLink 1016 provides one or more high-speed communication links between the parallel processing unit modules and the central processing unit 1406 through the switch 1404. In yet another embodiment (not shown), the interconnect 1018 provides one or more communication links between each of the parallel processing unit modules directly. One or more of the NVLink 1016 high-speed communication links may be implemented as a physical NVLink interconnect or either an on-chip or on-die interconnect using the same protocol as the NVLink 1016.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 1402 may be implemented as a circuit board substrate and each of the parallel processing unit modules and/or memory 1012 modules may be packaged devices. In an embodiment, the central processing unit 1406, switch 1404, and the parallel processing module 1402 are situated on a single semiconductor platform.

In an embodiment, the signaling rate of each NVLink 1016 is 20 to 25 Gigabits/second and each parallel processing unit module includes six NVLink 1016 interfaces (as shown in FIG. 14, five NVLink 1016 interfaces are included for each parallel processing unit module). Each NVLink 1016 provides a data transfer rate of 25 Gigabytes/second in each direction, with six links providing 300 Gigabytes/second. The NVLink 1016 can be used exclusively for PPU-to-PPU communication as shown in FIG. 14, or some combination of PPU-to-PPU and PPU-to-CPU, when the central processing unit 1406 also includes one or more NVLink 1016 interfaces.

In an embodiment, the NVLink 1016 allows direct load/store/atomic access from the central processing unit 1406 to each parallel processing unit module's memory 1012. In an embodiment, the NVLink 1016 supports coherency operations, allowing data read from the memory 1012 modules to be stored in the cache hierarchy of the central processing unit 1406, reducing cache access latency for the central processing unit 1406. In an embodiment, the NVLink 1016 includes support for Address Translation Services (ATS), enabling the parallel processing unit module to directly access page tables within the central processing unit 1406. One or more of the NVLink 1016 may also be configured to operate in a low-power mode.

Figure 15:
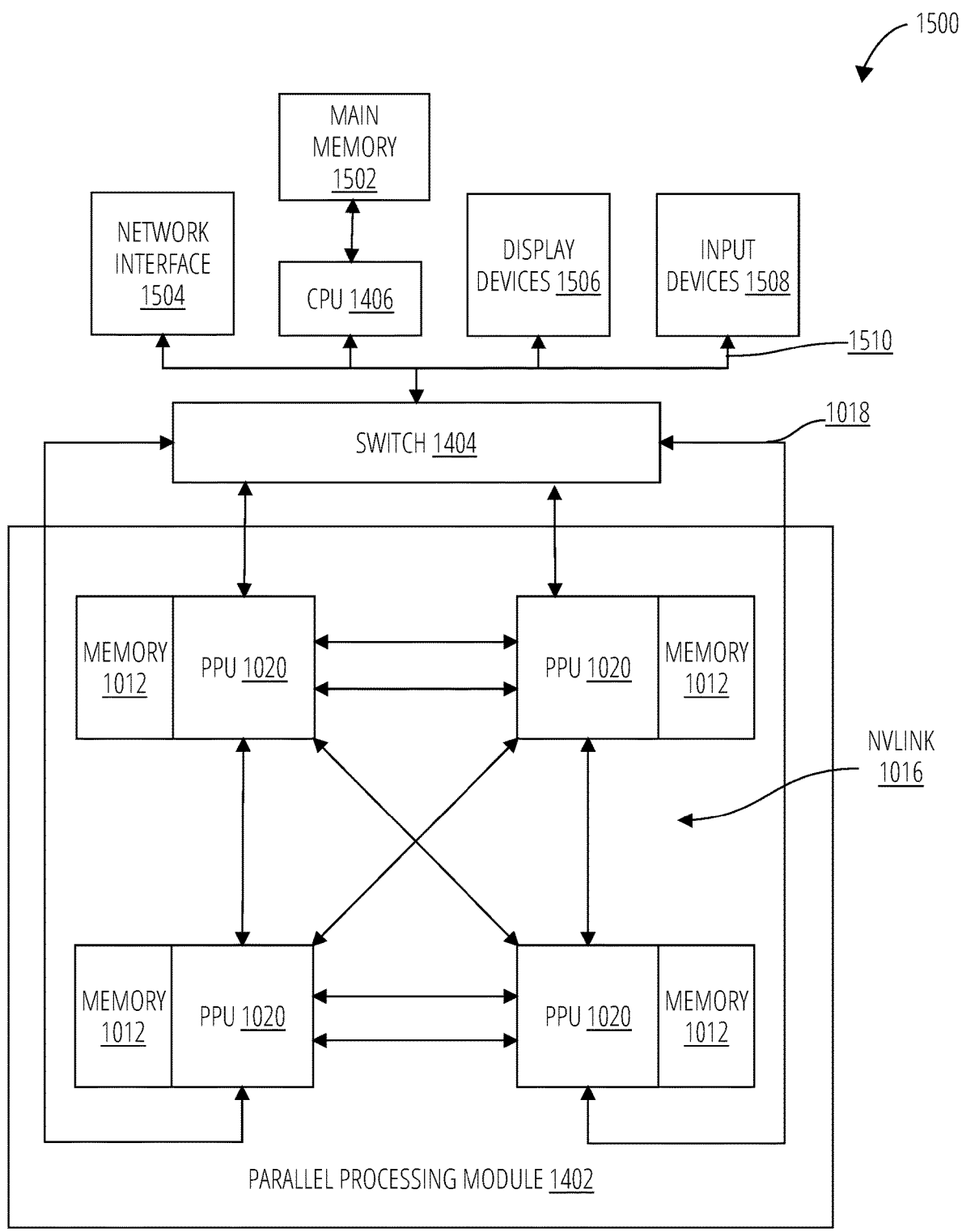
FIG. 15 depicts an exemplary processing system 1500 in accordance with another embodiment.

FIG. 15 depicts an exemplary processing system 1500 in which the various architecture and/or functionality of the various previous embodiments may be implemented. As shown, an exemplary processing system 1500 is provided including at least one central processing unit 1406 that is connected to a communications bus 1510. The communication communications bus 1510 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 1500 also includes a main memory 1502. Control logic (software) and data are stored in the main memory 1502 which may take the form of random access memory (RAM).

The exemplary processing system 1500 also includes input devices 1508, the parallel processing module 1402, and display devices 1506, e.g. a conventional CRT (cathode ray tube), LCD (liquid crystal display), LED (light emitting diode), plasma display or the like. User input may be received from the input devices 1508, e.g., keyboard, mouse, touchpad, microphone, and the like. Each of the foregoing modules and/or devices may even be situated on a single semiconductor platform to form the exemplary processing system 1500. Alternately, the various modules may also be situated separately or in various combinations of semiconductor platforms per the desires of the user.

Further, the exemplary processing system 1500 may be coupled to a network (e.g., a telecommunications network, local area network (LAN), wireless network, wide area network (WAN) such as the Internet, peer-to-peer network, cable network, or the like) through a network interface 1504 for communication purposes.

The exemplary processing system 1500 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1502 and/or the secondary storage. Such computer programs, when executed, enable the exemplary processing system 1500 to perform various functions. The main memory 1502, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 1500 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

Figure 16:
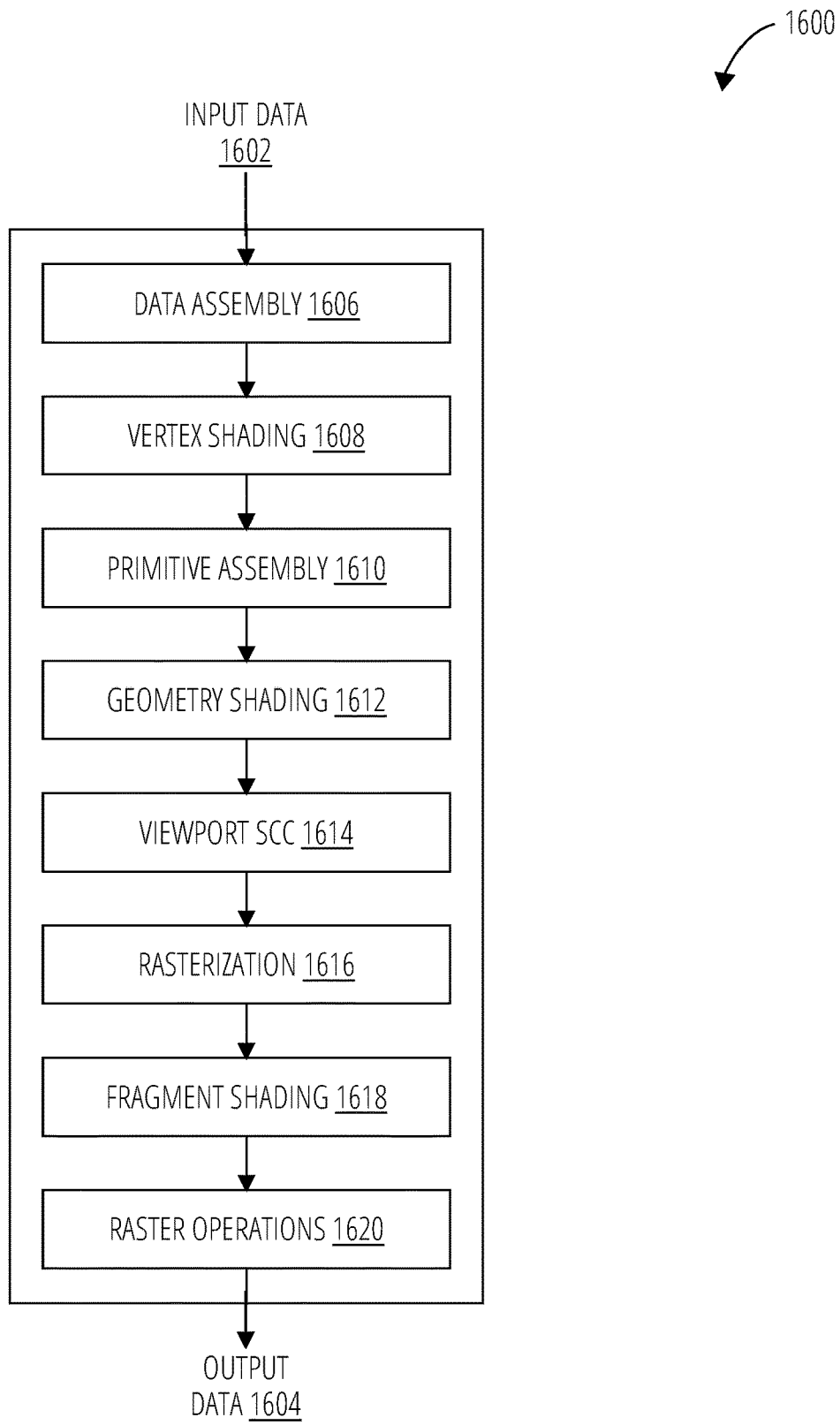
FIG. 16 depicts a graphics processing pipeline 1600 in accordance with one embodiment.

FIG. 16 is a conceptual diagram of a graphics processing pipeline 1600 implemented by the parallel processing unit 1020 of FIG. 10, in accordance with an embodiment. In an embodiment, the parallel processing unit 1020 comprises a graphics processing unit (GPU). The parallel processing unit 1020 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 1020 can be configured to process the graphics primitives to generate a frame buffer (e.g., pixel data for each of the pixels of the display).

An application writes model data for a scene (e.g., a collection of vertices and attributes) to a memory such as a system memory or memory 1012. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the streaming multiprocessor 1300 modules of the parallel processing unit 1020 including one or more of a vertex shader, hull shader, domain shader, geometry shader, and a pixel shader. For example, one or more of the streaming multiprocessor 1300 modules may be configured to execute a vertex shader program that processes a number of vertices defined by the model data. In an embodiment, the different streaming multiprocessor 1300 modules may be configured to execute different shader programs concurrently. For example, a first subset of streaming multiprocessor 1300 modules may be configured to execute a vertex shader program while a second subset of streaming multiprocessor 1300 modules may be configured to execute a pixel shader program. The first subset of streaming multiprocessor 1300 modules processes vertex data to produce processed vertex data and writes the processed vertex data to the level two cache 1204 and/or the memory 1012. After the processed vertex data is rasterized (e.g., transformed from three-dimensional data into two-dimensional data in screen space) to produce fragment data, the second subset of streaming multiprocessor 1300 modules executes a pixel shader to produce processed fragment data, which is then blended with other processed fragment data and written to the frame buffer in memory 1012. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 1600 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1600 receives input data 601 that is transmitted from one stage to the next stage of the graphics processing pipeline 1600 to generate output data 1604. In an embodiment, the graphics processing pipeline 1600 may represent a graphics processing pipeline defined by the OpenGL® API. As an option, the graphics processing pipeline 1600 may be implemented in the context of the functionality and architecture of the previous Figures and/or any subsequent Figure(s).

As shown in FIG. 16, the graphics processing pipeline 1600 comprises a pipeline architecture that includes a number of stages. The stages include, but are not limited to, a data assembly 1606 stage, a vertex shading 1608 stage, a primitive assembly 1610 stage, a geometry shading 1612 stage, a viewport SCC 1614 stage, a rasterization 1616 stage, a fragment shading 1618 stage, and a raster operations 1620 stage. In an embodiment, the input data 1602 comprises commands that configure the processing units to implement the stages of the graphics processing pipeline 1600 and geometric primitives (e.g., points, lines, triangles, quads, triangle strips or fans, etc.) to be processed by the stages. The output data 1604 may comprise pixel data (e.g., color data) that is copied into a frame buffer or other type of surface data structure in a memory.

The data assembly 1606 stage receives the input data 1602 that specifies vertex data for high-order surfaces, primitives, or the like. The data assembly 1606 stage collects the vertex data in a temporary storage or queue, such as by receiving a command from the host processor that includes a pointer to a buffer in memory and reading the vertex data from the buffer. The vertex data is then transmitted to the vertex shading 1608 stage for processing.

The vertex shading 1608 stage processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading 1608 stage may manipulate individual vertex attributes such as position, color, texture coordinates, and the like. In other words, the vertex shading 1608 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 1608 stage generates transformed vertex data that is transmitted to the primitive assembly 1610 stage.

The primitive assembly 1610 stage collects vertices output by the vertex shading 1608 stage and groups the vertices into geometric primitives for processing by the geometry shading 1612 stage. For example, the primitive assembly 1610 stage may be configured to group every three consecutive vertices as a geometric primitive (e.g., a triangle) for transmission to the geometry shading 1612 stage. In some embodiments, specific vertices may be reused for consecutive geometric primitives (e.g., two consecutive triangles in a triangle strip may share two vertices). The primitive assembly 1610 stage transmits geometric primitives (e.g., a collection of associated vertices) to the geometry shading 1612 stage.

The geometry shading 1612 stage processes geometric primitives by performing a set of operations (e.g., a geometry shader or program) on the geometric primitives. Tessellation operations may generate one or more geometric primitives from each geometric primitive. In other words, the geometry shading 1612 stage may subdivide each geometric primitive into a finer mesh of two or more geometric primitives for processing by the rest of the graphics processing pipeline 1600. The geometry shading 1612 stage transmits geometric primitives to the viewport SCC 1614 stage.

In an embodiment, the graphics processing pipeline 1600 may operate within a streaming multiprocessor and the vertex shading 1608 stage, the primitive assembly 1610 stage, the geometry shading 1612 stage, the fragment shading 1618 stage, and/or hardware/software associated therewith, may sequentially perform processing operations. Once the sequential processing operations are complete, in an embodiment, the viewport SCC 1614 stage may utilize the data. In an embodiment, primitive data processed by one or more of the stages in the graphics processing pipeline 1600 may be written to a cache (e.g. L1 cache, a vertex cache, etc.). In this case, in an embodiment, the viewport SCC 1614 stage may access the data in the cache. In an embodiment, the viewport SCC 1614 stage and the rasterization 1616 stage are implemented as fixed function circuitry.

The viewport SCC 1614 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 1616 stage.

The rasterization 1616 stage converts the 3D geometric primitives into 2D fragments (e.g. capable of being utilized for display, etc.). The rasterization 1616 stage may be configured to utilize the vertices of the geometric primitives to setup a set of plane equations from which various attributes can be interpolated. The rasterization 1616 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 1616 stage generates fragment data (e.g., interpolated vertex attributes associated with a particular sample location for each covered pixel) that are transmitted to the fragment shading 1618 stage.

The fragment shading 1618 stage processes fragment data by performing a set of operations (e.g., a fragment shader or a program) on each of the fragments. The fragment shading 1618 stage may generate pixel data (e.g., color values) for the fragment such as by performing lighting operations or sampling texture maps using interpolated texture coordinates for the fragment. The fragment shading 1618 stage generates pixel data that is transmitted to the raster operations 1620 stage.

The raster operations 1620 stage may perform various operations on the pixel data such as performing alpha tests, stencil tests, and blending the pixel data with other pixel data corresponding to other fragments associated with the pixel. When the raster operations 1620 stage has finished processing the pixel data (e.g., the output data 1604), the pixel data may be written to a render target such as a frame buffer, a color buffer, or the like.

It will be appreciated that one or more additional stages may be included in the graphics processing pipeline 1600 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 1612 stage). Other types of graphics processing pipelines are contemplated as being within the scope of the present disclosure. Furthermore, any of the stages of the graphics processing pipeline 1600 may be implemented by one or more dedicated hardware units within a graphics processor such as parallel processing unit 1020. Other stages of the graphics processing pipeline 1600 may be implemented by programmable hardware units such as the streaming multiprocessor 1300 of the parallel processing unit 1020.

The graphics processing pipeline 1600 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 1020. The API provides an abstraction for a programmer that lets a programmer utilize specialized graphics hardware, such as the parallel processing unit 1020, to generate the graphical data without requiring the programmer to utilize the specific instruction set for the parallel processing unit 1020. The application may include an API call that is routed to the device driver for the parallel processing unit 1020. The device driver interprets the API call and performs various operations to respond to the API call. In some instances, the device driver may perform operations by executing instructions on the CPU. In other instances, the device driver may perform operations, at least in part, by launching operations on the parallel processing unit 1020 utilizing an input/output interface between the CPU and the parallel processing unit 1020. In an embodiment, the device driver is configured to implement the graphics processing pipeline 1600 utilizing the hardware of the parallel processing unit 1020.

Various programs may be executed within the parallel processing unit 1020 in order to implement the various stages of the graphics processing pipeline 1600. For example, the device driver may launch a kernel on the parallel processing unit 1020 to perform the vertex shading 1608 stage on one streaming multiprocessor 1300 (or multiple streaming multiprocessor 1300 modules). The device driver (or the initial kernel executed by the parallel processing unit 1020) may also launch other kernels on the parallel processing unit 1020 to perform other stages of the graphics processing pipeline 1600, such as the geometry shading 1612 stage and the fragment shading 1618 stage. In addition, some of the stages of the graphics processing pipeline 1600 may be implemented on fixed unit hardware such as a rasterizer or a data assembler implemented within the parallel processing unit 1020. It will be appreciated that results from one kernel may be processed by one or more intervening fixed function hardware units before being processed by a subsequent kernel on a streaming multiprocessor 1300.

LISTING OF DRAWING ELEMENTS

302 transmission gate
304 signal repeater 402 circuit
404 interconnect or fabric
406 circuit system
408 circuit
410 computing system
412 vehicle
414 robot
502 signaling interconnect
504 signal transmission stages
602 control circuit
604 repeater stage
606 signal transmission path
608 adjustable delay element
610 adjustable delay element
612 adjustable delay element
614 pulse generator
616 adjustable delay element
618 adjustable delay element
620 CMS-mode enable
622 driver
624 pulse repeater
626 clock pulse generator
628 clock pulse generator
702 pulse generator
802 adjustable delay element
804 adjustable delay element
806 adjustable delay element
808 adjustable delay element
902 coarse delay adjustment element
904 fine delay adjustment element
906 fixed delay element
1002 I/O unit
1004 front-end unit
1006 hub
1008 scheduler unit
1010 work distribution unit
1012 memory
1014 crossbar
1016 NVLink
1018 interconnect
1020 parallel processing unit
1100 general processing cluster
1102 pipeline manager
1104 pre-raster operations unit
1106 data processing cluster
1108 raster engine
1110 M-pipe controller
1112 primitive engine
1114 work distribution crossbar
1116 memory management unit
1200 memory partition unit
1202 raster operations unit
1204 level two cache
1206 memory interface
1300 streaming multiprocessor
1302 instruction cache
1304 scheduler unit
1306 dispatch
1308 register file
1310 core
1312 special function unit
1314 load/store unit
1316 interconnect network
1318 shared memory/L1 cache
1400 processing system
1402 parallel processing module
1404 switch
1406 central processing unit
1500 exemplary processing system
1502 main memory
1504 network interface
1506 display devices
1508 input devices
1510 communications bus
1600 graphics processing pipeline
1602 input data
1604 output data
1606 data assembly
1608 vertex shading
1610 primitive assembly
1612 geometry shading
1614 viewport SCC
1616 rasterization
1618 fragment shading
1620 raster operations Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element.

Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A circuit comprising:
   a transmission line to propagate a signal through a serially-arranged plurality of repeaters;
   a control circuit to propagate control pulses to the repeaters, wherein a timing and duration of the control pulses is configured to operate the repeaters in current-mode signaling (CMS) mode during a state transition of the signal at the repeaters and to operate the repeaters in voltage-mode signaling (VMS) mode otherwise; and
   the circuit configured such that propagation of the signal along the transmission line is initiated by a first clock signal and a duration and timing of the control pulses is determined by a second clock signal.

2. The circuit of claim 1, wherein the control circuit is configured to propagate the control pulses to the repeaters in VMS-mode.

3. The circuit of claim 1, further comprising:
   a plurality of tunable delay circuits to configure a phase between the first clock signal and the second clock signal.

4. The circuit of claim 1, a tunable delay circuit to configure one or both of the timing and duration of the control pulses.

5. The circuit of claim 1, the control circuit comprising a same number of repeaters as the transmission line.

6. The circuit of claim 1, wherein the control pulses operate transmission gates shunting the repeaters.

7. A signaling interconnect comprising:
   a plurality of transmission lines;
   a plurality of repeaters arranged along the transmission lines;
   a plurality of transmission gates arranged along the transmission lines;
   at least one control circuit configured to propagate control pulses sequentially to the transmission gates;
   wherein a timing and width of the control pulses are configured to sequentially close the transmission gates prior to and during the state transition of signals on the transmission lines at the inputs of the repeaters and to sequentially open the transmission gates subsequent to the state transition at outputs of the repeaters; and
   one or more pulse generators to generate the timing and width of the control pulses for the transmission lines in the signaling interconnect.

8. A circuit comprising:
   a first clock pulse generator configured to generate a first clock pulse;
   a second clock pulse generator configured to generate a second clock pulse earlier than the first clock pulse;
   a control pulse generator configured to convert the second clock pulse into a control pulse;
   a transmission line configured to initiate propagation of a signal upon receiving the first clock pulse, the transmission line comprising a plurality of first repeaters, the first repeaters each shunted by a transmission gate; and
   a control circuit configured to propagate the control pulse sequentially to the transmission gates.

9. The circuit of claim 8, wherein a timing and width of the control pulse are configured to close the transmission gates in advance of a state transition of the signal at inputs of corresponding first repeaters of the transmission gates, and to open the transmission gates subsequent to the state transition of the signal at outputs of the corresponding first repeaters.

10. The circuit of claim 8, the first clock pulse generator comprising a first tunable delay element.

11. The circuit of claim 8, the second clock pulse generator comprising a second tunable delay element.

12. The circuit of claim 8, the control pulse generator comprising a third tunable delay element.

13. The circuit of claim 8, further comprising:
a plurality of stages;
a fourth tunable delay element disposed between the first clock pulse generator and the stages; and
a fifth tunable delay element disposed between the second clock pulse generator and the stages.

14. The circuit of claim 8, the control circuit comprising a plurality of second repeaters, each of the second repeaters comprising a propagation delay matched to a propagation delay of a corresponding one of the first repeaters.

15. The circuit of claim 14, wherein the second repeaters are configured to operate in a VMS mode.

16. The circuit of claim 14, the control circuit comprising a metal width formed to propagate signals faster than the signal transmission line.

17. A circuit comprising:
a transmission line configured to initiate propagation of a signal through a serially-arranged plurality of repeaters upon receiving a first clock pulse, at least some of the repeaters each shunted by a corresponding transmission gate;
a control circuit configured to propagate a control pulse sequentially to the transmission gates; and
wherein a timing and width of the control pulse are configured to close the corresponding transmission gates in advance of a state transition of the signal at inputs of the repeaters and to open the corresponding transmission gates subsequent to the state transition of the signal at outputs of the repeaters.

* * * * *